US011515236B2

(12) United States Patent
Hong et al.

(10) Patent No.: US 11,515,236 B2
(45) Date of Patent: Nov. 29, 2022

(54) POWER MODULE AND SUBSTRATE STRUCTURE APPLIED TO POWER MODULES (71) Applicants: HYUNDAI MOTOR COMPANY, Seoul (KR); KIA MOTORS CORPORATION, Seoul (KR)

(72) Inventors: Kyoung Kook Hong, Hwaseong-si (KR); Young Seok Kim, Seongnam-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 228 days.

(21) Appl. No.: 16/924,334

(22) Filed: Jul. 9, 2020

(65) Prior Publication Data
US 2021/0159152 A1  May 27, 2021

(30) Foreign Application Priority Data

Nov. 25, 2019  (KR) .......................... 10-2019-0152208

(51) Int. Cl.
| | |
|---|---|
| H01L 23/02 | (2006.01) |
| H01L 23/34 | (2006.01) |
| H01L 23/48 | (2006.01) |
| H01L 21/00 | (2006.01) |
| H01L 21/30 | (2006.01) |
| H05K 7/00 | (2006.01) |

(Continued)

(52) U.S. Cl.
CPC .... *H01L 23/49568* (2013.01); *H01L 23/4952* (2013.01); *H01L 23/49503* (2013.01); *H01L 23/49562* (2013.01); *H01L 23/49575* (2013.01)

(58) Field of Classification Search
CPC ......... H01L 23/49568; H01L 23/49503; H01L 23/4952; H01L 23/49562; H01L 23/49575; H01L 27/124; H01L 25/072; H01L 23/3735; H01L 24/49
See application file for complete search history.

(56) References Cited

U.S. PATENT DOCUMENTS

| | | | |
|---|---|---|---|
| 2011/0128713 A1* | 6/2011 | Kawano | ................... H01L 24/48 361/784 |
| 2017/0133294 A1* | 5/2017 | Ikeda | ...................... H01L 25/07 |

FOREIGN PATENT DOCUMENTS

| | | |
|---|---|---|
| JP | 2017-005043 A | 1/2017 |
| JP | 6338937 B2 | 6/2018 |
| JP | 6368646 B2 | 8/2018 |

\* cited by examiner

*Primary Examiner* — Alonzo Chambliss
(74) *Attorney, Agent, or Firm* — McDonnell Boehnen Hulbert & Berghoff LLP (57) ABSTRACT

An embodiment of the present disclosure provides a substrate structure applied to a power module. In the substrate structure applied to a power module, the substrate includes an upper substrate and a lower substrate, a plurality of semiconductor devices disposed on the lower substrate, a source signal electrode transmitting a source signal to the semiconductor devices, and a gate signal electrode transmitting a gate signal to the semiconductor devices, one of the source signal electrode or the gate signal electrode is connected to the upper substrate through a conductive column, and a signal transmitted by one of the source signal electrode or the gate signal electrode is transmitted to the semiconductor devices through the upper substrate.

19 Claims, 4 Drawing Sheets

(51) Int. Cl.
*H05K 1/11* (2006.01)
*H01L 23/495* (2006.01)

POWER MODULE AND SUBSTRATE STRUCTURE APPLIED TO POWER MODULES

CROSS REFERENCE TO RELATED APPLICATIONS

The present application claims priority to Korean Patent Application No. 10-2019-0152208, filed Nov. 25, 2019, the entire contents of which is incorporated herein for all purposes by this reference.

BACKGROUND

Field

The present disclosure relates to a power module having a conductive column connecting a lower substrate and an upper substrate, and a substrate structure applied to the power module.

Description of the Related Art

A power conversion device (e.g., an inverter), one component of a hybrid vehicle and an electric vehicle, has been technologically developed as an important part of eco-friendly vehicles. In the field of eco-friendly vehicles, development of a power module is paramount.

Several semiconductor devices can be mounted in a power module. When a current is applied to the power module, the current is applied to several semiconductor devices and the semiconductor devices convert the applied current. Accordingly, when the currents respectively applied to semiconductor devices of a power module have the same density, the function of the power module can be maximized.

However, since several semiconductor devices are mounted on one substrate, the area in which the semiconductor devices are disposed decreases, so the gaps between the semiconductor devices decrease. As the gaps between the semiconductor devices decrease, interference is caused by heat that is generated when the semiconductor devices are operated, which causes a problem that the operation temperature of the semiconductor devices increases or thermal stress increases at the joints of devices constituting the power module.

SUMMARY

An objective of the present disclosure is to provide a power module that provides a conductive column electrically connected to a source signal electrode with a portion of the source signal electrode removed to increase gaps between semiconductor devices, and a substrate structure that is applied to the power module.

An objective of the present disclosure is to provide a power module including a conductive column for electrically connecting a lower substrate and an upper substrate to each other and keeping the gap between the lower substrate and the upper substrate uniform, and a substrate structure that is applied to the power module.

An embodiment of the present disclosure provides a substrate structure applied to a power module.

In the substrate structure applied to a power module, the substrate includes an upper substrate and a lower substrate, a plurality of semiconductor devices are disposed on the lower substrate, a source signal electrode transmitting a source signal to the semiconductor devices, and a gate signal electrode transmitting a gate signal to the semiconductor devices, any one of the source signal electrode or the gate signal electrode is connected to the upper substrate through a conductive column, and a signal transmitted by any one of the source signal electrode or the gate signal electrode is transmitted to the semiconductor devices through the upper substrate In an embodiment, the conductive column may maintain a gap between the upper substrate and the lower substrate.

In an embodiment, the conductive column may be disposed adjacent to a corner of the lower substrate.

In an embodiment, the electrode connected to the conductive column may be disposed only at an edge of the lower substrate.

In an embodiment, the electrode not connected to the conductive column of the source signal electrode and the gate signal electrode may be disposed to surround the device regions.

In an embodiment, the electrode not connected to the conductive column may be electrically connected to the semiconductor devices through wires.

In an embodiment, the electrode connected to the conductive column may be disposed at an edge of the lower substrate that is adjacent to a lead frame that transmits a source signal and a gate signal to the lower substrate.

In an embodiment, the lower substrate may further include an input terminal region in which an input terminal that applies power to the lower substrate is disposed, and the electrode connected to the conductive column may be disposed at an edge of the lower substrate that is opposite to the input terminal region with the lower substrate therebetween.

In an embodiment, the lower substrate may further have a first edge that is adjacent to an input terminal region in which an imputer terminal that applies power to the lower substrate is disposed and a second edge disposed opposite to the first edge, and any one of the source signal electrode and the gate signal electrode that are connected to the conductive column may be disposed at the second edge.

In an embodiment, any one of the source signal electrode and the gate signal electrode that are connected to the conductive column may not be disposed at a third edge and a fourth edge that connect the first edge and the second edge to each other.

In an embodiment, the device regions may include a high-side device region in which high-side semiconductor devices are disposed and a low-side device region in which low-side semiconductor devices are disposed, the source signal electrode may include a high-side source signal electrode being adjacent to the high-side device region and a low-side source signal electrode being adjacent to the low-side device region, and the gate signal electrode may include a high-side gate signal electrode being adjacent to the high-side device region and a low-side gate signal electrode being adjacent to the low-side device region.

In an embodiment, the conductive column may include a high-side conductive column being adjacent to the high-side device region and a low-side conductive column being adjacent to the low-side device region, the high-side conductive column may be electrically connected to any one of the high-side source signal electrode and the high-side gate signal electrode, and the low-side conductive column may be electrically connected to any one of the low-side source signal electrode and the low-side gate signal electrode.

In an embodiment, the electrode not connected to the conductive column may be disposed at edges of the lower substrate that are disposed in a direction facing the low-side device region from the high-side device region.

In an embodiment, a spacer may be disposed on the semiconductor devices, and the spacer may be electrically connected to the upper substrate.

An embodiment of the present disclosure provides a power module. The power module includes an upper substrate and a lower substrate to which power and signals are applied, several semiconductor devices disposed on the lower substrate, and a conductive column electrically connecting the upper substrate and the lower substrate to each other, in which the conductive column is connected to any one of a source signal electrode and a gate signal electrode that are disposed on the lower substrate, and the semiconductor devices are connected to any one, which is not connected to the conductive column, of the source signal electrode and the gate signal electrode through wires.

In an embodiment, input terminals supplying power to the lower substrate may be provided, and any one, which is connected to the conductive column, of the source signal electrode and the gate signal electrode, may be disposed at edges disposed in parallel with an arrangement direction of the input terminals on the lower substrate.

In an embodiment, any one, which is connected to the conductive column, of the source signal electrode and the gate signal electrode may be disposed adjacent to an edge that is opposite to the edge where the input terminals are disposed.

In an embodiment, the source signal electrode and the gate signal electrode may be electrically connected to a lead frame transmitting a source signal and a gate signal to the lower substrate through wires, and the semiconductor devices may be electrically connected to any one, which is connected to the conductive column, of the source signal electrode and the gate signal electrode through wires.

In an embodiment, the semiconductor devices may receive a signal transmitted to the upper substrate through the conductive column through a spacer disposed between the semiconductor device and the upper substrate.

According to an embodiment of the present disclosure, since there is no source signal electrode in one direction of the lower substrate, the gaps between the semiconductor devices can increase. Accordingly, it is possible to maximally suppress thermal interference between the semiconductor devices and to decrease the operation temperature of the power module.

According to an embodiment of the present disclosure, since there is no source signal electrode in one direction of the lower substrate, the passage for transmitting a current input from an input terminal to the semiconductor devices can widen. Accordingly, heat generation by concentration of a current can be suppressed.

According to an embodiment of the present disclosure, the conductive column electrically connecting the upper substrate and the lower substrate to each other keeps the gap between the upper substrate and the lower substrate uniform, thereby being able to maximally suppress a defect that is caused by non-uniform thickness of the power module.

BRIEF DESCRIPTION OF THE FIGURES

The above and other objects, features and other advantages of the present disclosure will be more clearly understood from the following detailed description when taken in conjunction with the accompanying drawings, in which.

DETAILED DESCRIPTION

The advantages and features of the present disclosure, and methods of achieving them will be clear by referring to the exemplary embodiments that will be describe hereafter in detail with reference to the accompanying drawings. However, the present disclosure is not limited to the exemplary embodiments described hereafter and may be implemented in various ways, and the exemplary embodiments are provided to complete the description of the present disclosure and let those skilled in the art completely know the scope of the present disclosure and the present disclosure is defined by claims. Like reference numerals indicate like components throughout the specification.

Terms '~unit', '~er', etc. used herein mean the units for processing at least one function or operation and may be implemented by hardware, software, or a combination of hardware and software.

Some components are given terms 'first', 'second', etc. for discrimination throughout the specification because they have the same names, but they are not necessarily limited to the order in the following description.

The specification provides examples of the present disclosure. Further, the description provides an embodiment of the present disclosure and the present disclosure may be used in other various combination, changes, and environments. That is, the present disclosure may be changed or modified within the scope of the present disclosure described herein, a range equivalent to the description, and/or within the knowledge or technology in the related art. The embodiment shows an optimum state for achieving the spirit of the present disclosure and may be changed in various ways for the detailed application fields and use of the present disclosure. Therefore, the detailed description of the present disclosure is not intended to limit the present disclosure in the embodiment. Further, the claims should be construed as including other embodiments.

Figure 1:
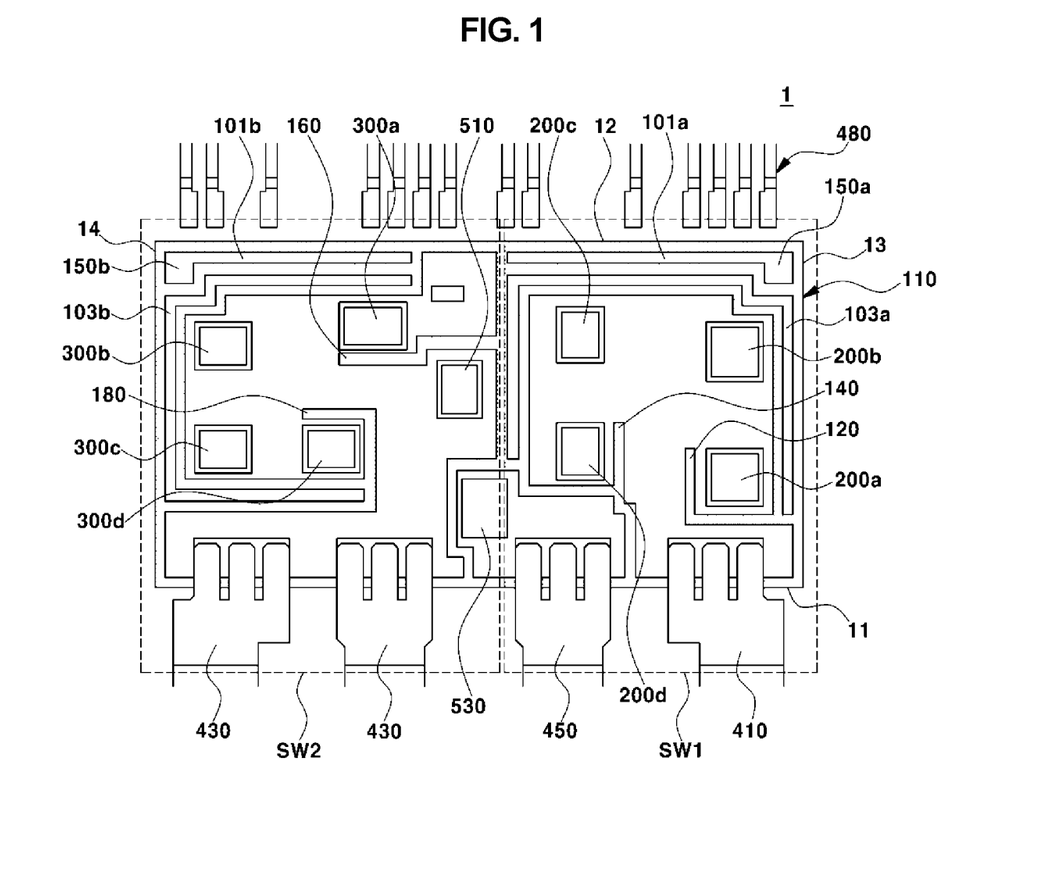
FIG. 1 is a diagram showing a lower substrate of a power module according to an embodiment of the present disclosure.

FIG. 1 is a diagram showing a lower substrate of a power module according to an embodiment of the present disclosure.

Referring to FIG. 1, a power module 1 may include a first switching unit SW1 and a second switching unit SW2. The first switching unit SW1 may include several components mounted in a first region of a lower substrate 110, and the second switching unit SW2 may include several components mounted in a second region of the lower substrate 110. The first switching unit SW1 and the second switching unit SW2 may be electrically connected to each other. The first switching unit SW1, which is a high-side switching unit, may include high-side semiconductor devices 200a, 200b, 200c, and 200d, a first input terminal 410, and an output terminal 450. The second switching unit SW2, which is a low-side switching unit, may include low-side semiconductor devices 300a, 300b, 300c, and 300d, a second input terminal 510, and an AC terminal 430. For example, the semiconductor devices 200a, 200b, 200c, 200d, 300a, 300b, 300c, and 300d may be MOSFETS made of one of silicon carbide (SiC), silicon (Si), and gallium nitride (GaN). A current converted by the high-side semiconductor devices 200a, 200b, 200c, and 200d may be applied to the second input terminal 510, and the current applied through the second input terminal 510 may be applied to the low-side semiconductor devices 300a, 300b, 300c, and 300d and the AC terminal 430. The current converted by the low-side semiconductor devices 300a, 300b, 300c, and 300d may be applied to a connection terminal 530. The current applied to the connection terminal 530 may be output through an output terminal 450 electrically connected to the connection terminal 530. The second input terminal 510 functions as a connection terminal connecting the first switching unit SW1 and the second switching unit SW2 of the lower substrate 110 to each other, but the second input terminal 510 may function as an input terminal that applies a current to the low-side semiconductor devices 300a, 300b, 300c, and 300d of the second switching unit SW2. The power module 1 according to an embodiment of the present disclosure may be configured in a 2-in-1 type in which the first switching unit SW1 and the second switching unit SW2 are formed on one lower substrate 110. Accordingly, there may be two AC terminals 430.

The lower substrate 110 may include a conductive layer. The lower substrate 110 and an upper substrate (not shown) may be provided for the power module 1. For example, the lower substrate 110 and the upper substrate (not shown) can transmit an applied current to the semiconductor devices 200a, 200b, 200c, 200d, 300a, 300b, 300c, and 300d, and may be electrically connected to several terminals 410, 430, 450, 510, and 530. That is, the lower substrate 110 can provide regions in which the semiconductor devices 200a, 200b, 200c, 200d, 300a, 300b, 300c, and 300d and the several terminals 410, 430, 450, 510, and 530 are mounted, and can electrically connect the semiconductor devices 200a, 200b, 200c, 200d, 300a, 300b, 300c, and 300d and the several terminals 410, 430, 450, 510, and 530.

The lower substrate 110 may be divided into a first region and a second region. The first region and the second region of the lower substrate 110 may be electrically insulated from each other. The high-side semiconductor devices 200a, 200b, 200c, and 200d, the first input terminal 410, and the output terminal 450 may be disposed in the first region of the lower substrate 110. The low-side semiconductor devices 300a, 300b, 300c, and 300d, the second input terminal 510, and the AC terminal 430 may be disposed in the second region of the lower substrate 110. The second input terminal 510 and the connection terminal 530 may be disposed on the lower substrate 110 to electrically connect the first region and the second region of the lower substrate 110.

The high-side semiconductor devices 200a, 200b, 200c, and 200d may be arranged counterclockwise. The high-side semiconductor devices 200a, 200b, 200c, and 200d may include a first high-side semiconductor device 200a, a second high-side semiconductor device 200b, a third high-side semiconductor device 200c, and a fourth high-side semiconductor device 200d. The first high-side semiconductor device 200a and the fourth high-side semiconductor device 200d may be disposed adjacent to the first input terminal 410. In detail, the first high-side semiconductor device 200a may be disposed adjacent to the first input terminal 410 and the fourth high-side semiconductor device 200d may be disposed adjacent to the output terminal 450. However, the first high-side semiconductor device 200a and the fourth high-side semiconductor device 200d may be electrically insulated from the output terminal 450 by a pattern formed on the lower substrate 110.

Slit insulators 120 and 140 may be defined in the first region of the lower substrate 110. The slit insulators 120 and 140 may mean spaces with a conductive layer, which is a part of the lower substrate 110, removed. The slit insulators 120 and 140 can prevent a current applied through the first input terminal 410 from concentrating to the first high-side semiconductor device 200a and the fourth high-side semiconductor device 200d. In detail, the slit insulators 120 and 140 may be defined between the first input terminal 410, the first high-side semiconductor device 200a, and the fourth high-side semiconductor device 200d so that a current applied through the first input terminal 410 is guided to the high-side semiconductor devices 200a, 200b, 200c, and 200d after being transmitted to the space between the high-side semiconductor devices 200a, 200b, 200c, and 200d. That is, the slit insulators 120 and 140 can change the transmission path of a current to prevent a current applied through the first input terminal 410 from being directly transmitted to the first high-side semiconductor device 200a and the fourth high-side semiconductor device 200d.

The slit insulators 120 and 140 may be defined by sides of the high-side semiconductor devices 200a and 200d that are adjacent to the first input terminal 410 of the high-side semiconductor devices 200a, 200b, 200c, and 200d. In detail, the slit insulators 120 and 140 may include a first slit insulator 120 defined on the lower substrate 110 at a side of the first high-side semiconductor device 200a and a second slit insulator 140 defined on the lower substrate 110 at a side of the fourth high-side semiconductor device 200d. The first slit insulator 120 and the second slit insulator 140 may extend from a first side of the lower substrate 110 at which the first input terminal 410 is disposed toward a second side opposite to the first side. In other words, the first slit insulator 120 may extend from the first high-side semiconductor device 200a toward the second high-side semiconductor device 200b, and the second slit insulator 140 may extend from the fourth high-side semiconductor device 200d toward the third high-side semiconductor device 200c. The first slit insulator 120 extends from the first side toward the second side of the lower substrate 110 may not protrude further than the end of the first high-side semiconductor device 200a. The second slit insulator 140 extends from the first side toward the second side of the lower substrate 110 may not protrude further than the end of the fourth high-side semiconductor device 200d. The first slit insulator 120 may extend to be adjacent to the second side further than the second slit insulator 140. The first slit insulator 120 and the second slit insulator 140 may be defined in the space between the first high-side semiconductor device 200a and the fourth high-side semiconductor device 200d.

The low-side semiconductor devices 300a, 300b, 300c, and 300d may be arranged counterclockwise. The low-side semiconductor devices 300a, 300b, 300c, and 300d may include a first low-side semiconductor device 300a, a second low-side semiconductor device 300b, a third low-side semiconductor device 300c, and a fourth low-side semiconductor device 300d. The first low-side semiconductor device 300a and the fourth low-side semiconductor device 300d may be disposed adjacent to the second input terminal 510. However, the first low-side semiconductor device 300a and the fourth low-side semiconductor device 300d may be electrically insulated from the output terminal 450 by a pattern formed on the lower substrate 110.

Slit insulators 160 and 180 may be defined in the second region of the lower substrate 110. The slit insulators 160 and 180 may mean spaces with a conductive layer, which is a part of the lower substrate 110, removed. The slit insulators 160 and 180 can prevent a current applied through the second input terminal 510 from concentrating to the first low-side semiconductor device 300a and the fourth low-side semiconductor device 300d. In detail, the slit insulators 160 and 180 may be defined between the second input terminal 510, the first low-side semiconductor device 300a, and the fourth low-side semiconductor device 300d so that a current applied through the second input terminal 510 is guided to the low-side semiconductor devices 300a, 300b, 300c, and 300d after being transmitted to the space between the low-side semiconductor devices 300a, 300b, 300c, and 300d. That is, the slit insulators 160 and 180 can change the transmission path of a current to prevent a current applied through the second input terminal 510 from being directly transmitted to the first low-side semiconductor device 300a and the fourth low-side semiconductor device 300d.

The slit insulators 160 and 180 may be defined by sides of the low-side semiconductor devices 300a and 300d that are adjacent to the second input terminal 510 of the low-side semiconductor devices 300a, 300b, 300c, and 300d. In detail, the slit insulators 160 and 180 may include a third slit insulator 160 defined on the lower substrate 110 at a side of the first low-side semiconductor device 300a and a fourth slit insulator 180 defined on the lower substrate 110 at a side of the fourth low-side semiconductor device 300d. The third slit insulator 160 and the fourth slit insulator 180 may extend from a first side of the lower substrate 110 at which the second input terminal 510 is disposed to a second side opposite to the first side. In other words, the third slit insulator 160 may extend from the first low-side semiconductor device 300a toward the second low-side semiconductor device 300b, and the fourth slit insulator 180 may extend from the fourth low-side semiconductor device 300d toward the third low-side semiconductor device 300c. The third slit insulator 160 extends from the first side toward the second side of the lower substrate 110 may not protrude further than the end of the first low-side semiconductor device 300a. The fourth slit insulator 180 extends from the first side toward the second side of the lower substrate 110 may not protrude further than the end of the fourth low-side semiconductor device 300d. The third slit insulator 160 may extend to be adjacent to the second side further than the fourth slit insulator 180. The third slit insulator 160 and the fourth slit insulator 180 may be defined in the space between the first low-side semiconductor device 300a and the fourth low-side semiconductor device 300d.

The lower substrate 110 may include source signal electrodes 101a and 101b that transmit source signals to the semiconductor devices 200a, 200b, 200c, 200d, 300a, 300b, 300c, and 300d, and gate signal electrodes 103a and 103b that transmit gate signals. The source signal electrodes 101a and 101b and the gate signal electrodes 103a and 103b may be electrically connected to each other. The source signal electrodes 101a and 101b and the gate signal electrodes 103a and 103b may be a portion of the conductive layer of the lower substrate 110. The source signal electrodes 101a and 101b may include a high-side source signal electrode 101a disposed in the first region of the lower substrate 110 and a low-side source signal electrode 101b disposed in the second region of the lower substrate 110. The signal electrodes 103a and 103b may include a high-side gate signal electrode 103a disposed in the first region of the lower substrate 110 and a low-side gate signal electrode 101b disposed in the second region of the lower substrate 110.

The high-side source signal electrode 101a and the low-side source signal electrode 101b may be disposed at an edge of the lower substrate 110. In detail, the high-side source signal electrode 101a and the low-side source signal electrode 101b may be disposed adjacent to one of four edges of the lower substrate 110. The high-side source signal electrode 101a and the low-side source signal electrode 101b may be disposed at an edge that is opposite to the edge where the input terminals 410 and 430 applying power to the lower substrate 110 are disposed. The high-side source signal electrode 101a and the low-side source signal electrode 101b may be disposed at a position that is opposite to an input terminal region in which the input terminals 410 and 430 applying power to the lower substrate 110 are disposed. For example, the lower substrate 110 may have a first edge 11 at which the input terminals 410, 430, and 450 are disposed, a second edge 12 at which the h-side source signal electrode 101a and the low-side source signal electrode 101b are disposed, and a third edge 13 and a fourth edge 14 connecting the first edge and the second edge. The high-side source signal electrode 101a and the low-side source signal electrode 101b may not be disposed at the third edge 13 and the fourth edge 14. In other words, high-side source signal electrode 101a and the low-side source signal electrode 101b may not be disposed at the edges 13 and 14 that are disposed in parallel with the arrangement direction of the input terminals 410 and 430. The first edge 11 and the second edge 12 may be disposed opposite to each other.

The high-side gate signal electrode 103a and the low-side gate signal electrode 103b may be disposed to surround the semiconductor devices 200a, 200b, 200c, 200d, 300a, 300b, 300c, and 300d. In detail, the high-side gate signal electrode 103a may be disposed to surround the high-side semiconductor devices 200a, 200b, 200c, and 200d, and the low-side gate signal electrode 103b may be disposed to surround the low-side semiconductor devices 300a, 300b, 300c, and 300d. The high-side gate signal electrode 103a and the low-side gate signal electrode 103b may be disposed adjacent to the second edge 12, the third edge 13, and the fourth edge 14 of the lower substrate 110.

Any one of the source signal electrodes 101a and 101b and the gate signal electrodes 103a and 103b may be connected to conductive columns 150a and 150b disposed on the lower substrate 110. Although the conductive columns 150a and 150b are connected to the source signal electrodes 101a and 101b in an embodiment of the present disclosure, the present disclosure is not limited thereto. An embodiment in which the conductive columns 150a and 150b are connected to the source signal electrodes 101a and 101b is described hereafter. The high-side source signal electrode 101a and the low-side source signal electrode 101b may be connected to the conductive columns 150a and 150b. The conductive columns 150a and 150b may be connected to the upper substrate (not shown) described above. The high-side source signal electrode 101a may be connected to a first conductive column 150a disposed in the first region and the low-side source signal electrodes 101b may be connected to a second conductive column 150b disposed in the second region. The conductive columns 150a and 150b may be disposed adjacent to a corner of the lower substrate 110. For example, the first conductive column 150a may be disposed adjacent to the corner where the second edge 12 and the third edge 13 meet each other, and the second conductive column 150b may be disposed adjacent to the corner where the second edge 12 and the fourth edge 14 meet each other. The first conductive column 150a is electrically connected to the high-side source signal electrode 101a, but may be insulated from the high-side semiconductor devices 200a, 200b, 200c, and 200d and the high-side gate signal electrode 103a.

The high-side gate signal electrode 103a and the low-side gate signal electrode 103b that are not connected to the conductive columns 150a and 150b may be electrically connected the semiconductor devices 200a, 200b, 200c, 200d, 300a, 300b, 300c, and 300d through wires.

A lead frame 480 has a plurality of frame terminals and may be connected to an external controller (not shown) and the semiconductor devices 200a, 200b, 200c, 200d, 300a, 300b, 300c, and 300d through at least one frame terminal. A lead frame 480 can transmit control signals (a source signal and a gate signal) of the external controller to the semiconductor devices 200a, 200b, 200c, 200d, 300a, 300b, 300c, and 300d. In detail, the lead frame 480 may be electrically connected to the source signal electrodes 101a and 101b and the gate signal electrodes 103a and 103b through wires (not shown). The lead frame 480 may be disposed opposite to the input terminals 410, 430, and 450 with the lower substrate 110 therebetween. The source signal electrodes 101a and 101b may be disposed at the second edge 12 of the lower substrate 110 that is adjacent to the lead frame 480.

According to an embodiment of the present disclosure, the electrodes (i.e., the source signal electrodes 101a and 101b) connected to the conductive column 150a and 150b may not be disposed at the edges 13 and 14 of the lower substrate that are disposed in the direction facing the device region in which the low-side semiconductor devices 300a, 300b, 300c, and 300d are disposed from the device region in which the high-side semiconductor devices 200a, 200b, 200c, and 200d are disposed. That is, only the gate signal electrodes 103a and 103b may be provided in a first direction facing the fourth edge 14 from the third edge 13. Since only the gate signal electrodes 103a and 103b are disposed in the first direction, the gaps between the semiconductor devices 200a, 200b, 200c, 200d, 300a, 300b, 300c, and 300d may increase. When all of the source signal electrodes 101a and 101b and the gate signal electrodes 103a and 103b are disposed in the first direction, the gaps between the semiconductor devices 200a, 200b, 200c, 200d, 300a, 300b, 300c, and 300d are relatively small, so there is a problem that interference is caused by heat that is generated when the semiconductor devices 200a, 200b, 200c, 200d, 300a, 300b, 300c, and 300d are operated, so the operation temperature of the semiconductor devices 200a, 200b, 200c, 200d, 300a, 300b, 300c, and 300d increases. However, in the power module 1 according to an embodiment of the present disclosure, only the gate signal electrodes 103a and 103b are disposed in the first direction and the source signal electrodes 101a and 101b are connected to the conductive columns 150a and 150b, thereby being able to increase the gaps between the semiconductor devices 200a, 200b, 200c, 200d, 300a, 300b, 300c, and 300d. Accordingly, it is possible to maximally discharge the heat that is generated when the power module 1 is switched and it is also possible to suppress thermal interference between the semiconductor devices 200a, 200b, 200c, 200d, 300a, 300b, 300c, and 300d, so it is possible to decrease the operation temperature of the power module 1.

Figure 2:
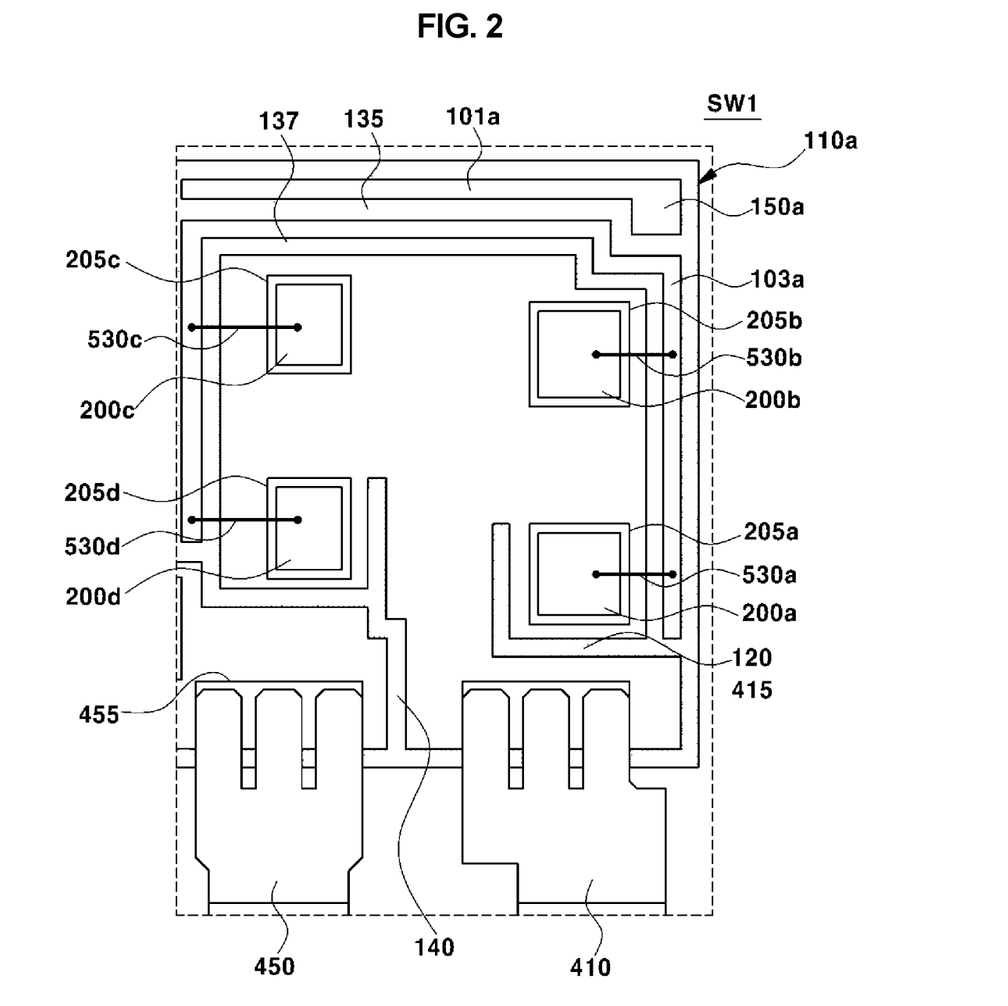
FIG. 2 is a diagram showing a first region of the lower substrate according to an embodiment of the present disclosure.

FIG. 2 is a diagram showing the first region of the lower substrate according to an embodiment of the present disclosure. Repeated description is not provided for brief description.

Referring to FIG. 2, the high-side source signal electrode 101a and the high-side gate signal electrode 103a may be disposed adjacent to high-side device regions 205a, 205b, 205c, and 205d. The high-side source signal electrode 101a may be disposed at a side of the high-side device regions 205a, 205b, 205c, and 205d and the high-side gate signal electrode 103a may be disposed to surround the high-side device regions 205a, 205b, 205c, and 205d. The high-side source signal electrode 101a may be connected to the first conductive column 150a. The first high-side semiconductor device 200a may be disposed in a first high-side device region 205a, the second high-side semiconductor device 200b may be disposed in a second high-side device region 205b, the third high-side semiconductor device 200c may be disposed in a third high-side device region 205c, and the fourth high-side semiconductor device 200d may be disposed in a fourth high-side device region 205d.

A first electrode insulator 135 may be provided between the high-side source signal electrode 101a and the high-side gate signal electrode 103a. Accordingly, the high-side gate signal electrode 103a can be electrically insulated from the high-side source signal electrode 101a and the first conductive column 150a.

A second electrode insulator 137 may be provided between the high-side gate signal electrode 103a and the high-side device regions 205a, 205b, 205c, and 205d. The high-side gate signal electrode 103a and the high-side device regions 205a, 205b, 205c, and 205d are not electrically connected by the conductive layer of the first region 110a, but may be electrically connected by high-side wires 530a, 530b, 530c, and 530d. In detail, the first high-side semiconductor device 200a may be electrically connected to the high-side gate signal electrode 103a by a first wire 530a, the second high-side semiconductor device 200b may be electrically connected to the high-side gate signal electrode 103a by a second wire 530b, the third high-side semiconductor device 200c may be electrically connected to the high-side gate signal electrode 103a by a third wire 530c, and the fourth high-side semiconductor device 200d may be electrically connected to the high-side gate signal electrode 103a by a fourth wire 530d. In this configuration, the high-side source signal electrode 101a may not be connected to the high-side semiconductor devices 200a, 200b, 200c, and 200d through a wire.

According to an embodiment of the present disclosure, since there is no high-side source signal electrode 101a in the transverse direction of the first region 110a (direction facing the fourth high-side semiconductor device 200d from the first high-side semiconductor device 200a), the gaps between the high-side semiconductor devices 200a, 200b, 200c, and 200d can be increased. Accordingly, it is possible to maximally suppress thermal interference between the high-side semiconductor devices 200a, 200b, 200c, and 200d.

According to an embodiment of the present disclosure, since there is no high-side source signal electrode 101a in the transverse direction of the first region 110a, the passage for transmitting a current input from the first input terminal 410 to the high-side semiconductor devices 200a, 200b, 200c, and 200d may widen. The passage may mean the space between the first slit insulator 120 and the second slit insulator 140. That is, the space between the first high-side semiconductor device 200a and the fourth high-side semiconductor device 200d increases, so the path can widen. Accordingly, heat generation by concentration of a current can be suppressed.

Figure 3:
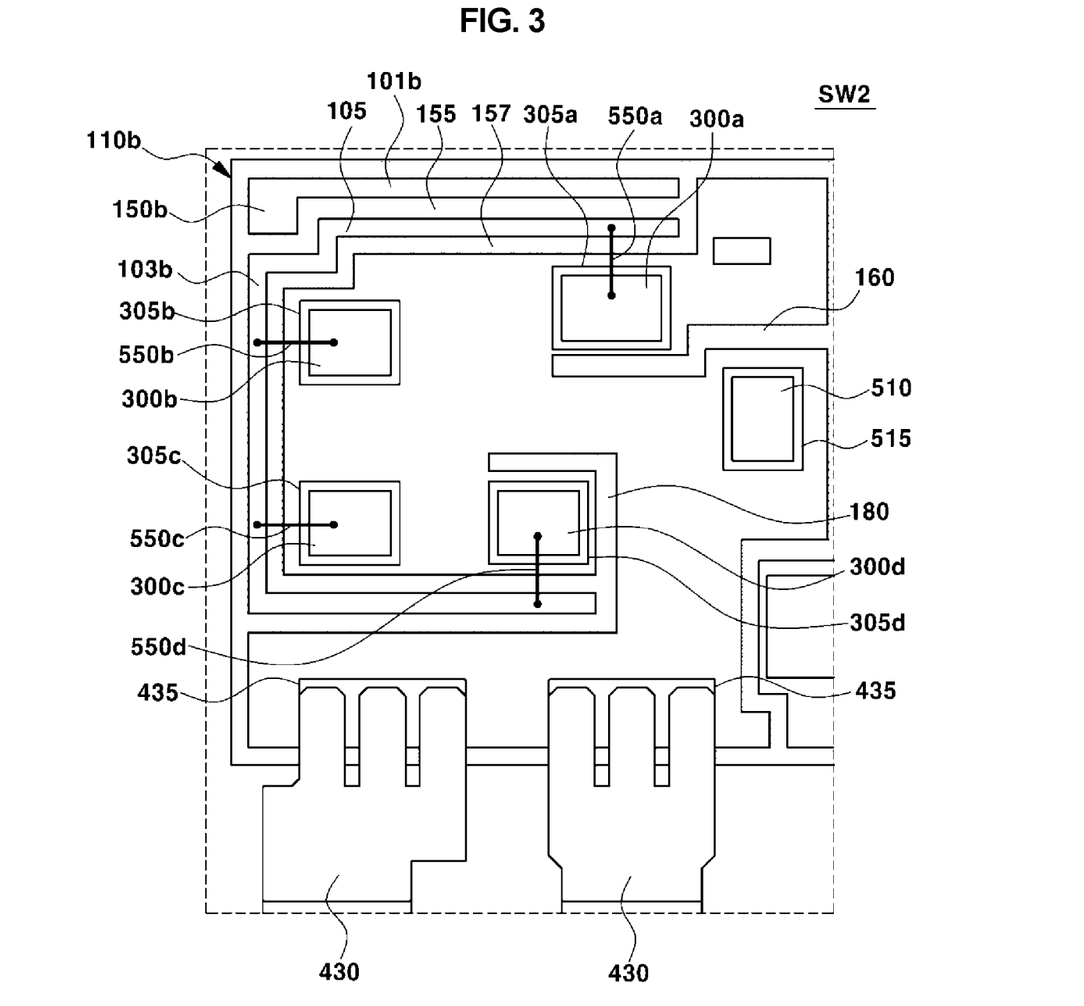
FIG. 3 is a diagram showing a second region of the lower substrate according to an embodiment of the present disclosure.

FIG. 3 is a diagram showing the second region of the lower substrate according to an embodiment of the present disclosure. Repeated description is not provided for brief description.

Referring to FIG. 3, the low-side source signal electrode 101b and the low-side gate signal electrode 103b may be disposed adjacent to low-side device regions 305a, 305b, 305c, and 305d. The low-side source signal electrode 101b may be disposed at a side of the low-side device regions 305a, 305b, 305c, and 305d and the low-side gate signal electrode 103b may be disposed to surround the low-side device regions 305a, 305b, 305c, and 305d. The low-side source signal electrode 101b may be connected to the second conductive column 150b. The first low-side semiconductor device 300a may be disposed in a first low-side device region 305a, the second low-side semiconductor device 300b may be disposed in a second low-side device region 305b, the third low-side semiconductor device 300c may be disposed in a third low-side device region 305c, and the fourth low-side semiconductor device 300d may be disposed in a fourth low-side device region 305d.

A third electrode insulator 155 may be provided between the low-side source signal electrode 101b and the low-side gate signal electrode 103b. Accordingly, the low-side gate signal electrode 103b can be electrically insulated from the low-side source signal electrode 101b and the second conductive column 150b.

A fourth electrode insulator 157 may be provided between the low-side gate signal electrode 103b and the low-side device regions 305a, 305b, 305c, and 305d. The low-side gate signal electrode 103b and the low-side device regions 305a, 305b, 305c, and 305d are not electrically connected by the conductive layer of the second region 110b, but may be electrically connected by low-side wires 550a, 550b, 550c, and 550d. In detail, the first low-side semiconductor device 300a may be electrically connected to the low-side gate signal electrode 103b by a fifth wire 550a, the second low-side semiconductor device 300b may be electrically connected to the low-side gate signal electrode 103b by a sixth wire 550b, the third low-side semiconductor device 300c may be electrically connected to the low-side gate signal electrode 103b by a seventh wire 550c, and the fourth low-side semiconductor device 300d may be electrically connected to the low-side gate signal electrode 103b by an eighth wire 550d. In this configuration, the low-side source signal electrode 101b may not be connected to the high-side semiconductor devices 300a, 300b, 300c, and 300d through a wire.

According to an embodiment of the present disclosure, since there is no low-side source signal electrode 101b in the transverse direction of the second region 110b (direction facing the second low-side semiconductor device 300b from the first low-side semiconductor device 300a), the gaps between the low-side semiconductor devices 300a, 300b, 300c, and 300d can be increased. Accordingly, it is possible to maximally suppress thermal interference between the low-side semiconductor devices 300a, 300b, 300c, and 300d.

According to an embodiment of the present disclosure, since there is no low-side source signal electrode 101b in the transverse direction of the second region 110b, the passage for transmitting a current input from the connection terminal 510 to the low-side semiconductor devices 300a, 300b, 300c, and 300d may widen. The passage may mean the space between the third slit insulator 160 and the fourth slit insulator 180. That is, the space between the first low-side semiconductor device 300a and the fourth low-side semiconductor device 300d increases, so the path can widen. Accordingly, heat generation by concentration of a current can be suppressed.

Figure 4:
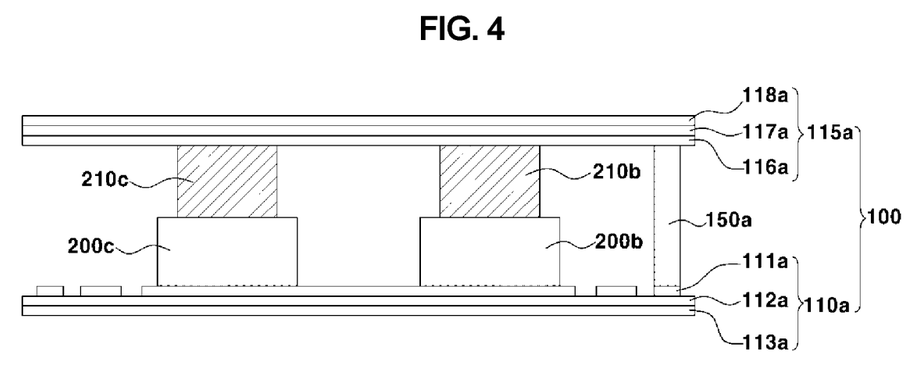
FIG. 4 is a cross-sectional view taken along line A-A' of FIG. 2.

FIG. 4 is a cross-sectional view taken along line A-A' of FIG. 2.

Referring to FIGS. 2 and 4, the substrate 100 may include a lower substrate 100a and an upper substrate 115a. The lower substrate 110a may include an upper conductive layer 111a, an insulating layer 112a, and a lower conductive layer 113a, and the upper substrate 115a may include an upper conductive layer 116a, an insulating layer 117a, and a lower conductive layer 118a. A configuration in which the high-side semiconductor devices 200a, 200b, 200c, and 200d and the first conductive column 150a are disposed on the lower substrate 110a may be exemplified in an embodiment of the present disclosure.

The high-side source signal electrode 101a is electrically connected to the first conductive column 150a and the first conductive column 150a can transmit a source signal to the upper conductive layer 116a of the upper substrate 115a. The upper conductive layer 116a may be electrically connected to a second spacer 210b and a third spacer 210c stacked on the second high-side semiconductor device 200b and the third high-side semiconductor device 200c. Accordingly, a source signal transmitted by the first conductive column 150a can be transmitted to the second high-side semiconductor device 200b and the third high-side semiconductor device 200c.

The first conductive column 150a may be disposed between the lower substrate 110a and the upper substrate 115a, thereby being able to maintain the gap between the lower substrate 110a and the upper substrate 115a. Accordingly, the first conductive column 150a can maximally suppress a defect caused by non-uniform thickness of the power module.

Figure 5:
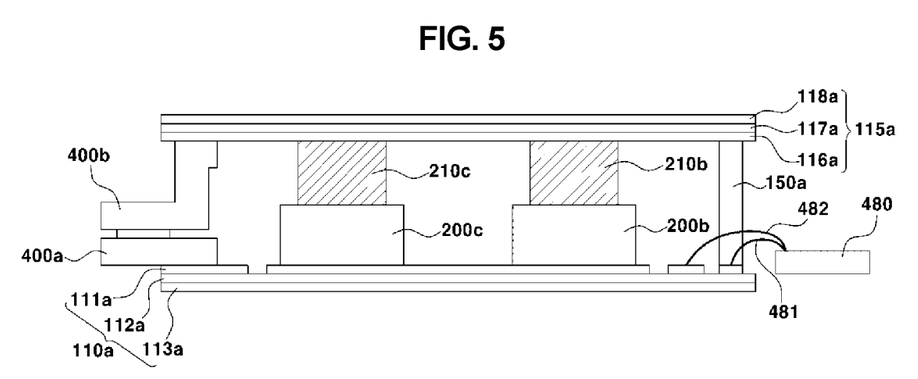
FIG. 5 is a side view of a power module according to an embodiment of the present disclosure.

FIG. 5 is a side view of a power module according to an embodiment of the present disclosure. FIG. 5 is a view showing the first region of the lower substrate from a side. Repeated description is not provided for brief description.

Referring to FIGS. 1, 2, and 5, the high-side source signal electrode 101a and the high-side gate signal electrode 103a can be electrically connected to the lead frame 480 transmitting a source signal and a gate signal through wires 481 and 482. In detail, the high-side source signal electrode 101a may be electrically connected to the lead frame 480 through the wire 481 and electrically connected to the upper substrate 115a through the first conductive column 150a. The high-side gate signal electrode 103a may be electrically connected to the lead frame 480 through the wire 482 and electrically connected to the high-side semiconductor devices 200a, 200b, 200c, and 200d through wires 530a, 530b, and 530d. The lower substrate 110a can receive power through a lower input terminal 400a and the upper substrate 115a can receive power through an upper input terminal 400b.

Although exemplary embodiments of the present disclosure were described above with reference to the accompanying drawings, those skilled in the art would understand that the present disclosure may be implemented in various ways without changing the necessary features or the spirit of the prevent disclosure. Therefore, the embodiments described above are only examples and should not be construed as being limiting in all respects.

The invention claimed is:

1. A substrate structure applied to a power module comprising,
an upper substrate and a lower substrate;
a plurality of semiconductor devices disposed on device regions of the lower substrate;
a source signal electrode transmitting a source signal to the plurality of semiconductor devices; and
a gate signal electrode transmitting a gate signal to the plurality of semiconductor devices;

wherein one of the source signal electrode or the gate signal electrode is connected to the upper substrate through a conductive column;
wherein a signal transmitted by one of the source signal electrode or the gate signal electrode is transmitted to the semiconductor devices through the upper substrate; and
wherein a signal transmitted by an other of the source signal electrode or the gate signal electrode is transmitted to the semiconductor devices through a wire.

2. The substrate structure of claim 1, wherein the conductive column maintains a gap between the upper substrate and the lower substrate.

3. The substrate structure of claim 1, wherein the conductive column is disposed adjacent to a corner of the lower substrate.

4. The substrate structure of claim 1, wherein one of the source signal electrode or the gate signal electrode connected to the conductive column is disposed only at an edge of the lower substrate.

5. The substrate structure of claim 4, wherein one of the source signal electrode or the gate signal electrode not connected to the conductive column is disposed to surround the device regions.

6. The substrate structure of claim 5, wherein one of the source signal electrode or the gate signal electrode not connected to the conductive column is electrically connected to the plurality of semiconductor devices through wires.

7. The substrate structure of claim 4, wherein one of the source signal electrode or the gate signal electrode connected to the conductive column is disposed at an edge of the lower substrate that is adjacent to a lead frame that transmits a source signal and a gate signal to the lower substrate.

8. The substrate structure of claim 4, wherein the lower substrate further includes an input terminal region in which an input terminal that applies power to the lower substrate is disposed; and
the electrode connected to the conductive column is disposed at an edge of the lower substrate that is opposite to the input terminal region with the lower substrate therebetween.

9. The substrate structure of claim 1, wherein the lower substrate further includes a first edge that is adjacent to an input terminal region in which an input terminal that applies power to the lower substrate is disposed, and a second edge disposed opposite to the first edge; and
one of the source signal electrode and the gate signal electrode that is connected to the conductive column is disposed at the second edge.

10. The substrate structure of claim 9, wherein one of the source signal electrode and the gate signal electrode that is connected to the conductive column is not disposed at a third edge and a fourth edge that connect the first edge and the second edge to each other.

11. The substrate structure of claim 1, wherein the device regions include a high-side device region in which high-side semiconductor devices are disposed and a low-side device region in which low-side semiconductor devices are disposed;
the source signal electrode includes a high-side source signal electrode being adjacent to the high-side device region and a low-side source signal electrode being adjacent to the low-side device region; and
the gate signal electrode includes a high-side gate signal electrode being adjacent to the high-side device region and a low-side gate signal electrode being adjacent to the low-side device region.

12. The substrate structure of claim 11, wherein the conductive column includes a high-side conductive column being adjacent to the high-side device region and a low-side conductive column being adjacent to the low-side device region;
the high-side conductive column is electrically connected to one of the high-side source signal electrode and the high-side gate signal electrode; and
the low-side conductive column is electrically connected to one of the low-side source signal electrode and the low-side gate signal electrode.

13. The substrate structure of claim 11, wherein the electrode not connected to the conductive column is disposed at edges of the lower substrate that are disposed in a direction facing the low-side device region from the high-side device region.

14. The substrate structure of claim 1, wherein a spacer is disposed on the plurality of semiconductor devices, and the spacer is electrically connected to the upper substrate.

15. A power module comprising:
an upper substrate and a lower substrate to which power and signals are applied;
a plurality of semiconductor devices disposed on the lower substrate; and
a conductive column electrically connecting the upper substrate and the lower substrate to each other;
wherein the conductive column is connected to one of a source signal electrode and a gate signal electrode that are disposed on the lower substrate; and
the plurality of semiconductor devices are connected to one of the source signal electrode and the gate signal electrode, which is not connected to the conductive column, through wires;
wherein a signal transmitted by an other of the source signal electrode and the gate signal electrode is transmitted to the plurality of semiconductor devices through the upper substrate.

16. The power module of claim 15, wherein input terminals supplying power to the lower substrate are provided; and
one of the source signal electrode and the gate signal electrode, which is connected to the conductive column, is disposed at edges disposed in parallel with an arrangement direction of the input terminals on the lower substrate.

17. The power module of claim 16, wherein one of the source signal electrode and the gate signal electrode, which is connected to the conductive column, is disposed adjacent to an edge that is opposite to the edge where the input terminals are disposed.

18. The power module of claim 16, wherein the source signal electrode and the gate signal electrode are electrically connected to a lead frame transmitting a source signal and a gate signal to the lower substrate through wires; and
the plurality of semiconductor devices are electrically connected to one of the source signal electrode and the gate signal electrode, which is connected to the conductive column, through wires.

19. The power module of claim 18, wherein the plurality of semiconductor devices receive a signal transmitted to the upper substrate through the conductive column through a spacer disposed between the semiconductor device and the upper substrate.

* * * * *